United States Patent
Lee et al.

(10) Patent No.: US 10,096,540 B2
(45) Date of Patent: Oct. 9, 2018

(54) SEMICONDUCTOR DEVICE AND METHOD OF FORMING DUMMY PILLARS BETWEEN SEMICONDUCTOR DIE AND SUBSTRATE FOR MAINTAINING STANDOFF DISTANCE

(75) Inventors: KyungHoon Lee, Kyunggi-Do (KR); SeongWon Park, Kyoungki-do (KR); KiYoun Jang, Kyoungki-do (KR); JaeHyun Lee, Kyunggi-Do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 1090 days.

(21) Appl. No.: 13/107,075

(22) Filed: May 13, 2011

(65) Prior Publication Data

US 2012/0286418 A1    Nov. 15, 2012

(51) Int. Cl.
*H01L 23/498* (2006.01)
*H01L 21/50* (2006.01)
(Continued)

(52) U.S. Cl.
CPC ...... *H01L 23/49811* (2013.01); *H01L 21/563* (2013.01); *H01L 23/3121* (2013.01); *H01L 23/3128* (2013.01); *H01L 24/11* (2013.01); *H01L 24/81* (2013.01); *H01L 23/3192* (2013.01); *H01L 24/02* (2013.01); *H01L 24/03* (2013.01); *H01L 24/05* (2013.01); *H01L 24/13* (2013.01); *H01L 24/16* (2013.01); *H01L 24/29* (2013.01); *H01L 24/94* (2013.01); *H01L 2224/0231* (2013.01); *H01L 2224/0239* (2013.01); *H01L 2224/03013* (2013.01); *H01L 2224/0332* (2013.01); *H01L 2224/0343* (2013.01); *H01L 2224/0345* (2013.01);
(Continued)

(58) Field of Classification Search
USPC .. 257/E23.049, E23.059, E23.135, E23.136, 257/666–786; 438/108, 620, 613
See application file for complete search history.

(56) References Cited

U.S. PATENT DOCUMENTS 3,458,925 A * 8/1969 Napier .............. H01L 21/67121
228/180.22
3,591,839 A * 7/1971 Evans .................... H01L 23/10
174/253
(Continued)

*Primary Examiner* — Mark Tornow
*Assistant Examiner* — Abbigale Boyle
(74) *Attorney, Agent, or Firm* — Robert D. Atkins; Atkins and Associates, P.C.

(57) ABSTRACT

A semiconductor device has a semiconductor die with an insulation layer formed over an active surface of the semiconductor die. A conductive layer is formed over the first insulating layer electrically connected to the active surface. A plurality of conductive pillars is formed over the conductive layer. A plurality of dummy pillars is formed over the first insulating layer electrically isolated from the conductive layer and conductive pillars. The semiconductor die is mounted to a substrate. A height of the dummy pillars is greater than a height of the conductive pillars to maintain the standoff distance between the semiconductor die and substrate. The dummy pillars can be formed over the substrate. The dummy pillars are disposed at corners of the semiconductor die and a central region of the semiconductor die. A mold underfill material is deposited between the semiconductor die and substrate.

4 Claims, 15 Drawing Sheets

(51) Int. Cl.
*H01L 21/56* (2006.01)
*H01L 23/31* (2006.01)
*H01L 23/00* (2006.01)

(52) U.S. Cl.
CPC ........... *H01L 2224/0347* (2013.01); *H01L 2224/0361* (2013.01); *H01L 2224/03452* (2013.01); *H01L 2224/03462* (2013.01); *H01L 2224/03464* (2013.01); *H01L 2224/03912* (2013.01); *H01L 2224/0401* (2013.01); *H01L 2224/05548* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05671* (2013.01); *H01L 2224/10135* (2013.01); *H01L 2224/10165* (2013.01); *H01L 2224/1132* (2013.01); *H01L 2224/1145* (2013.01); *H01L 2224/11334* (2013.01); *H01L 2224/11452* (2013.01); *H01L 2224/11462* (2013.01); *H01L 2224/11464* (2013.01); *H01L 2224/11849* (2013.01); *H01L 2224/11901* (2013.01); *H01L 2224/131* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16146* (2013.01); *H01L 2224/2929* (2013.01); *H01L 2224/48091* (2013.01); *H01L 2224/73204* (2013.01); *H01L 2224/73265* (2013.01); *H01L 2224/81007* (2013.01); *H01L 2224/8114* (2013.01); *H01L 2224/81139* (2013.01); *H01L 2224/81815* (2013.01); *H01L 2224/83104* (2013.01); *H01L 2224/94* (2013.01); *H01L 2924/01029* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01); *H01L 2924/381* (2013.01); *H01L 2924/3841* (2013.01)

(56) References Cited

U.S. PATENT DOCUMENTS

| | | | | |
|---|---|---|---|---|
| 3,871,014 A | * | 3/1975 | King | H01L 24/12 228/180.22 |
| 3,871,015 A | * | 3/1975 | Lin et al. | 257/779 |
| 4,545,610 A | * | 10/1985 | Lakritz | H01L 21/4853 174/263 |
| 4,878,611 A | * | 11/1989 | LoVasco | H05K 3/303 228/180.22 |
| 5,400,950 A | | 3/1995 | Myers et al. | |
| 5,436,497 A | * | 7/1995 | Miyauchi et al. | 257/587 |
| 5,633,535 A | * | 5/1997 | Chao | H01L 24/75 257/738 |
| 5,700,715 A | | 12/1997 | Pasch | |
| 5,953,814 A | | 9/1999 | Sozansky et al. | |
| 6,249,038 B1 | * | 6/2001 | Daubenspeck | H01L 23/5258 257/209 |
| 6,324,069 B1 | * | 11/2001 | Weber | H01L 21/563 174/260 |
| 6,461,881 B1 | * | 10/2002 | Farnworth | G03F 7/70416 257/E21.511 |
| 6,677,677 B2 | * | 1/2004 | Kimura | H01L 23/50 257/737 |
| 6,864,574 B1 | * | 3/2005 | Nobori | H01L 23/3107 257/706 |
| 6,978,539 B2 | | 12/2005 | Kung et al. | |
| 7,045,900 B2 | * | 5/2006 | Hikita | H01L 23/49575 257/777 |
| 7,052,935 B2 | * | 5/2006 | Pai | H01L 24/17 257/734 |
| 7,224,071 B2 | * | 5/2007 | Odegard | H01L 21/563 257/778 |
| 7,462,942 B2 | * | 12/2008 | Tan et al. | 257/782 |
| 8,227,924 B2 | * | 7/2012 | Shen | H01L 23/3171 257/775 |
| 2002/0079577 A1 | * | 6/2002 | Ho | H01L 23/49816 257/737 |
| 2003/0003624 A1 | * | 1/2003 | Farooq | H01L 21/6835 438/108 |
| 2008/0224309 A1 | * | 9/2008 | Hori | H01L 24/81 257/737 |
| 2008/0293232 A1 | * | 11/2008 | Kang | H01L 24/14 438/612 |
| 2009/0008801 A1 | * | 1/2009 | Lai et al. | 257/782 |
| 2009/0152659 A1 | * | 6/2009 | Hiltunen | H04N 5/2253 257/432 |
| 2009/0200663 A1 | * | 8/2009 | Daubenspeck et al. | 257/737 |
| 2011/0198747 A1 | * | 8/2011 | Kuo | H01L 21/6836 257/737 |

\* cited by examiner

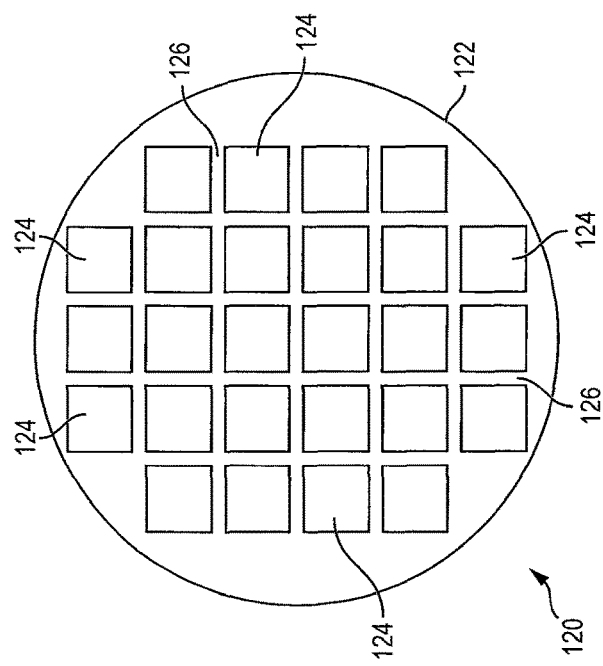
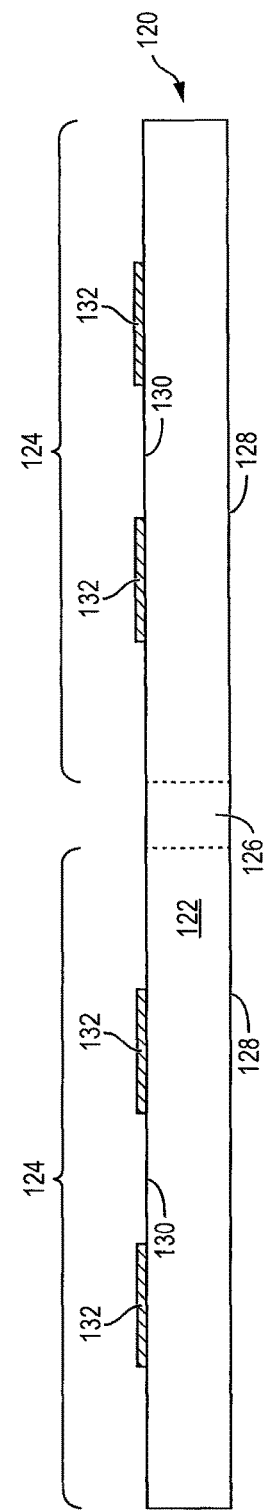
FIG. 4a
FIG. 4b

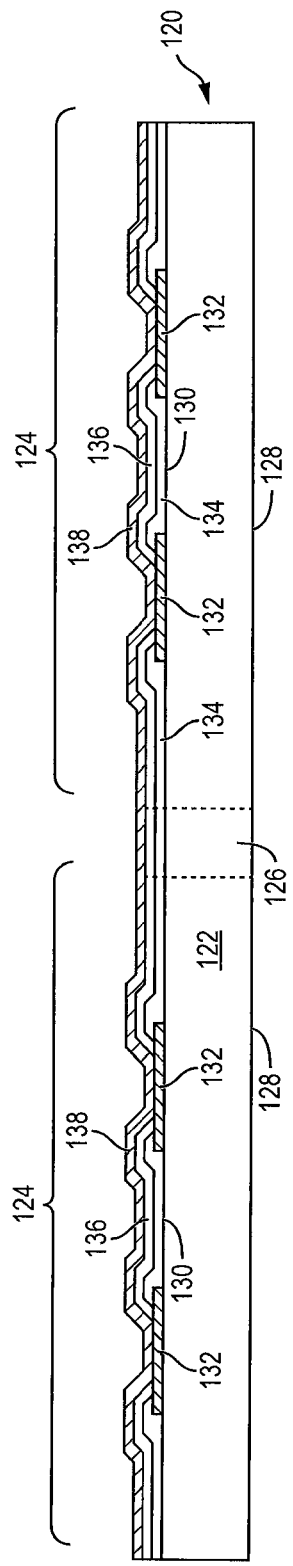
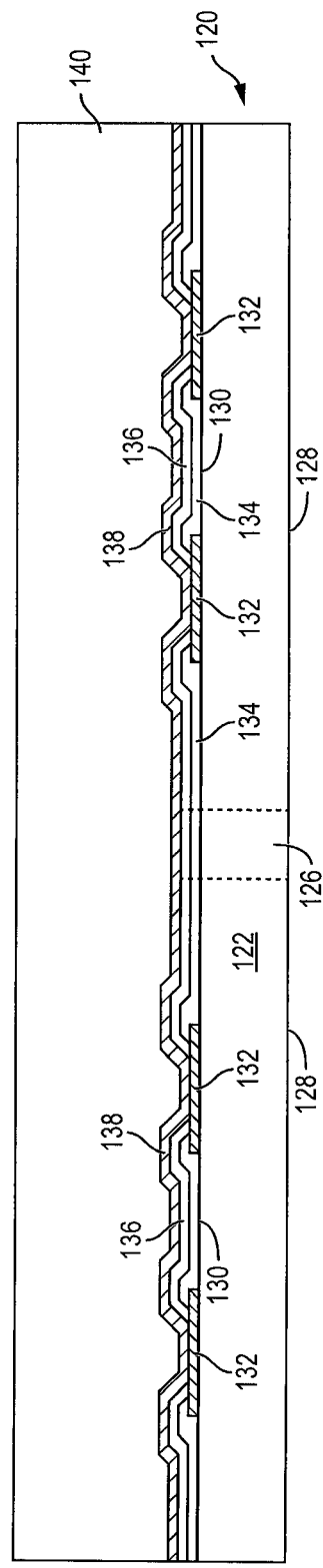

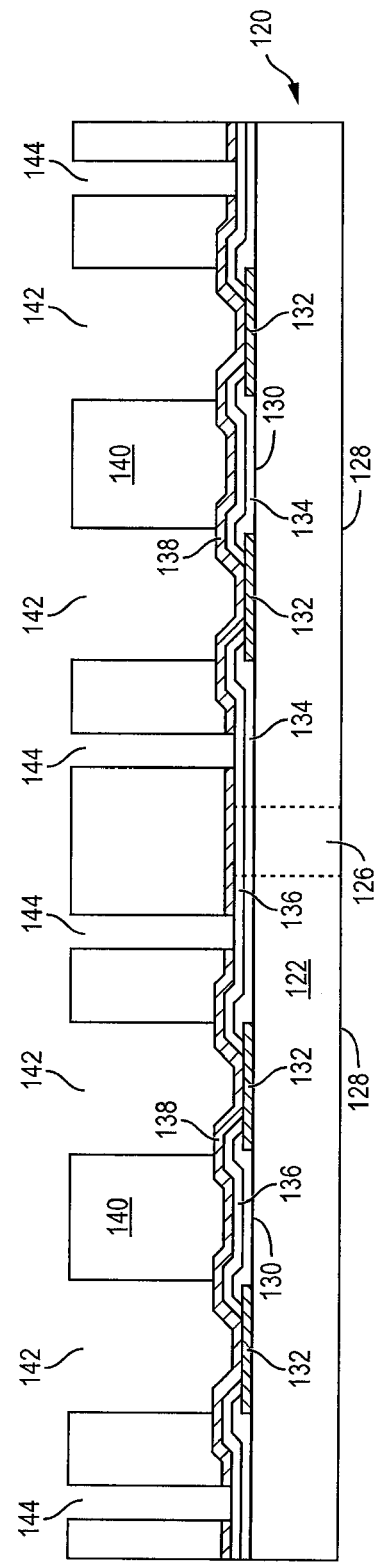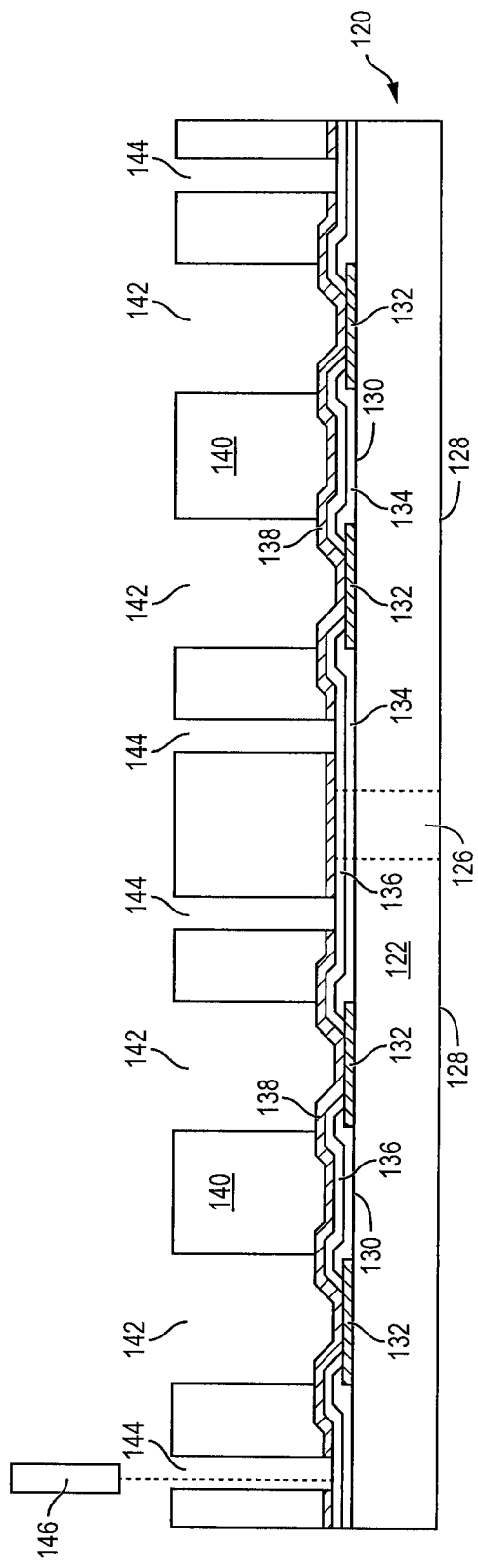

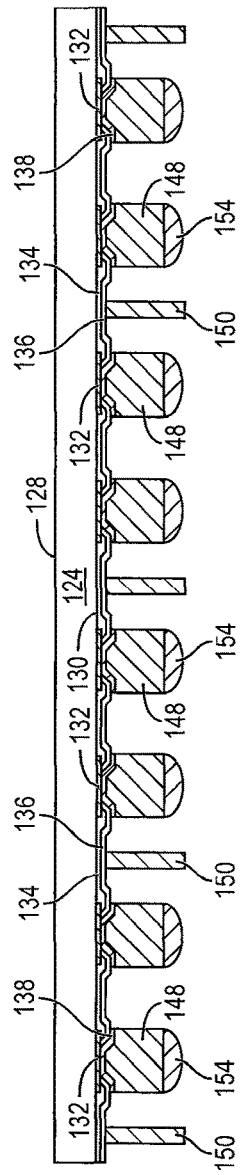
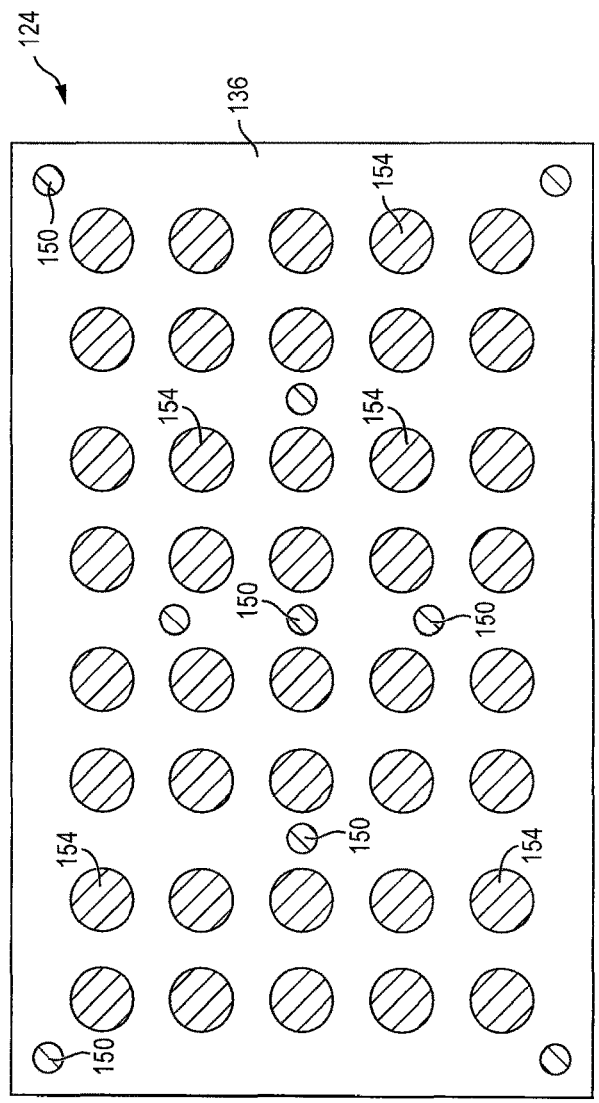
FIG. 5a
FIG. 5b

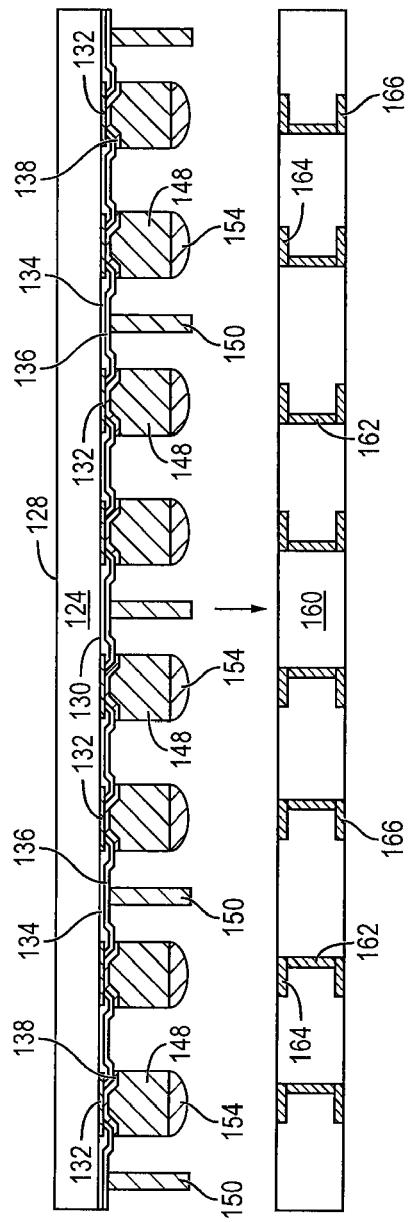
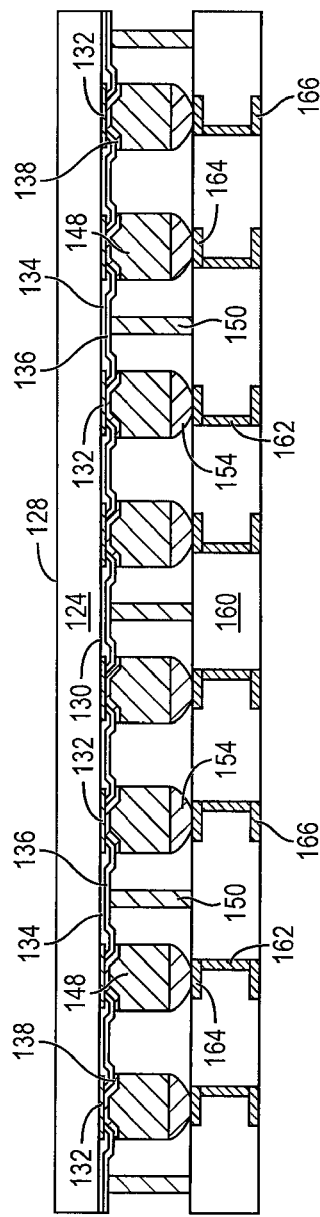
FIG. 6a
FIG. 6b

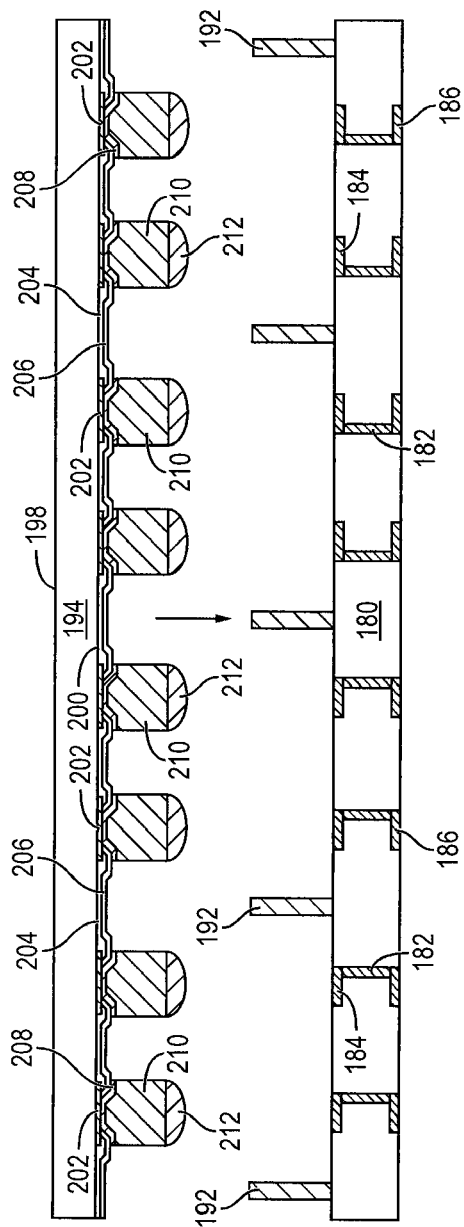
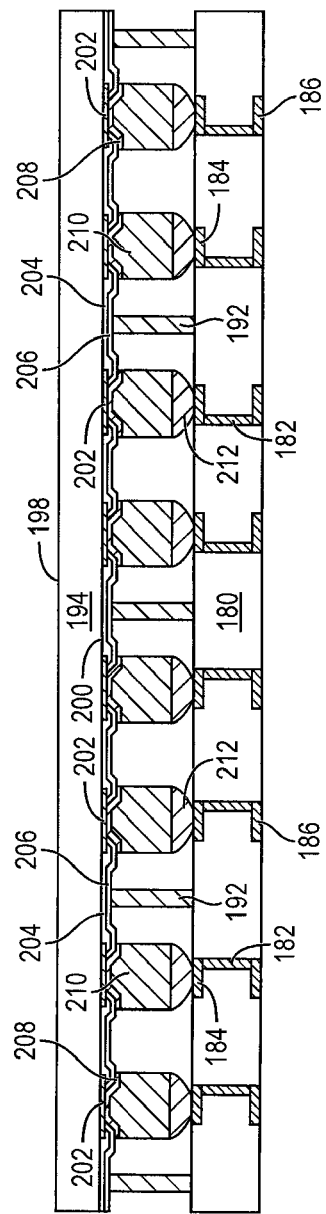
FIG. 8a
FIG. 8b

SEMICONDUCTOR DEVICE AND METHOD OF FORMING DUMMY PILLARS BETWEEN SEMICONDUCTOR DIE AND SUBSTRATE FOR MAINTAINING STANDOFF DISTANCE

FIELD OF THE INVENTION

The present invention relates in general to semiconductor devices and, more particularly, to a semiconductor device and method of forming dummy pillars between a semiconductor die and substrate to maintain a standoff distance between the semiconductor die and substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

FIG. 1 illustrates a conventional semiconductor device 10 with flipchip type semiconductor die 12 having contact pads 14 formed on an active surface 16. An insulating or passivation layer 18 is formed over active surface 16 and contact pads 14. A portion of insulating layer 18 is removed by an etching process to expose contact pads 14. An under bump metallization (UBM) layer 20 is formed over the exposed contact pads 14 and insulating layer 18. Conductive pillars 22 are formed over UBM 20. A bump material 24 is formed over conductive pillars 22. Semiconductor die 12 is mounted to substrate 26 and bump material 24 is reflowed to electrically connect conductive pillars 22 to conductive traces 28 on the substrate. The temperature and pressure of the reflow process can cause excess bump material 24 to flow outward and contact adjacent conductive traces 30, shown as electrical bridge 32. The formation of electrical bridge 32 is particularly prevalent in fine pitch interconnect applications. The electrical bridge 32 causes defects, lowers manufacturing yield, and increases cost. A larger spacing or pitch can be allocated between conductive pillars to allow for the outward flow of excess bump material without causing electrical bridging defects. However, the increase in pitch decreases interconnect density.

SUMMARY OF THE INVENTION

A need exists to reduce electrical bridging defects while maintaining a fine interconnect pitch. Accordingly, in one embodiment, the present invention is a method of making a semiconductor device comprising the steps of providing a semiconductor die, forming a first insulation layer over an active surface of the semiconductor die, forming a conductive layer over the first insulating layer electrically connected to the active surface of the semiconductor die, forming a plurality of conductive pillars over the conductive layer, forming a plurality of dummy pillars over the first insulating layer electrically isolated from the conductive layer and conductive pillars, providing a substrate, and mounting the semiconductor die to the substrate with the dummy pillars maintaining a standoff distance between the semiconductor die and substrate.

In another embodiment, the present invention is a method of making a semiconductor device comprising the steps of providing a semiconductor die, providing a substrate, forming a first insulation layer over the semiconductor die, forming a conductive layer over the first insulating layer, forming a plurality of conductive pillars over the conductive layer, forming a plurality of dummy pillars over the substrate or first insulating layer, and mounting the semiconductor die to the substrate with the dummy pillars maintaining a standoff distance between the semiconductor die and substrate.

In another embodiment, the present invention is a method of making a semiconductor device comprising the steps of providing a semiconductor die, forming a first insulation layer over the semiconductor die, forming a conductive layer over the first insulating layer, forming a plurality of conductive pillars over the conductive layer, and forming a plurality of dummy pillars over the first insulating layer electrically isolated from the first conductive layer and conductive pillars.

In another embodiment, the present invention is a semiconductor device comprising a semiconductor die and substrate and first insulation layer formed over the semiconductor die. A conductive layer is formed over the first insulating layer. A plurality of conductive pillars is formed over the conductive layer. A plurality of dummy pillars is formed over the substrate or first insulating layer. The semiconductor die is mounted to the substrate with the dummy pillars maintaining a standoff distance between the semiconductor die and substrate.

BRIEF DESCRIPTION OF THE DRAWINGS

FIGS. 4a-4m illustrate a process of forming dummy pillars over a semiconductor die to maintain a standoff distance between the semiconductor die and substrate;

FIGS. 5a-5b illustrate the semiconductor die with dummy pillars and conductive pillars;

FIGS. 6a-6d illustrate the semiconductor die mounted to the substrate with standoff maintained by the dummy pillars;

FIGS. 8a-8d illustrate the semiconductor die mounted to the substrate with a standoff distance maintained by the dummy pillars.

DETAILED DESCRIPTION OF THE DRAWINGS

Figure 1:
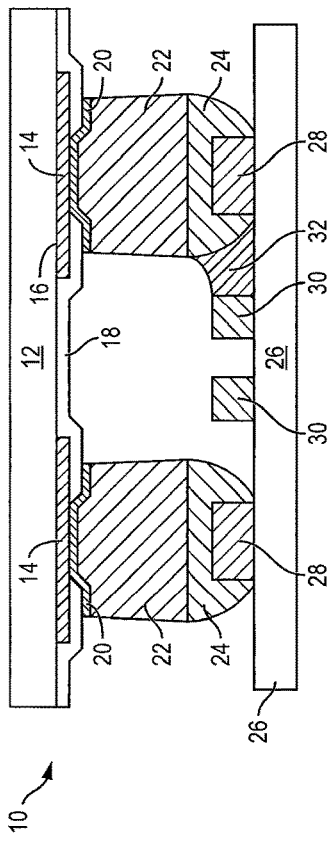
FIG. 1 shows a conventional semiconductor die mounted to a substrate with an electrical bridge defect.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
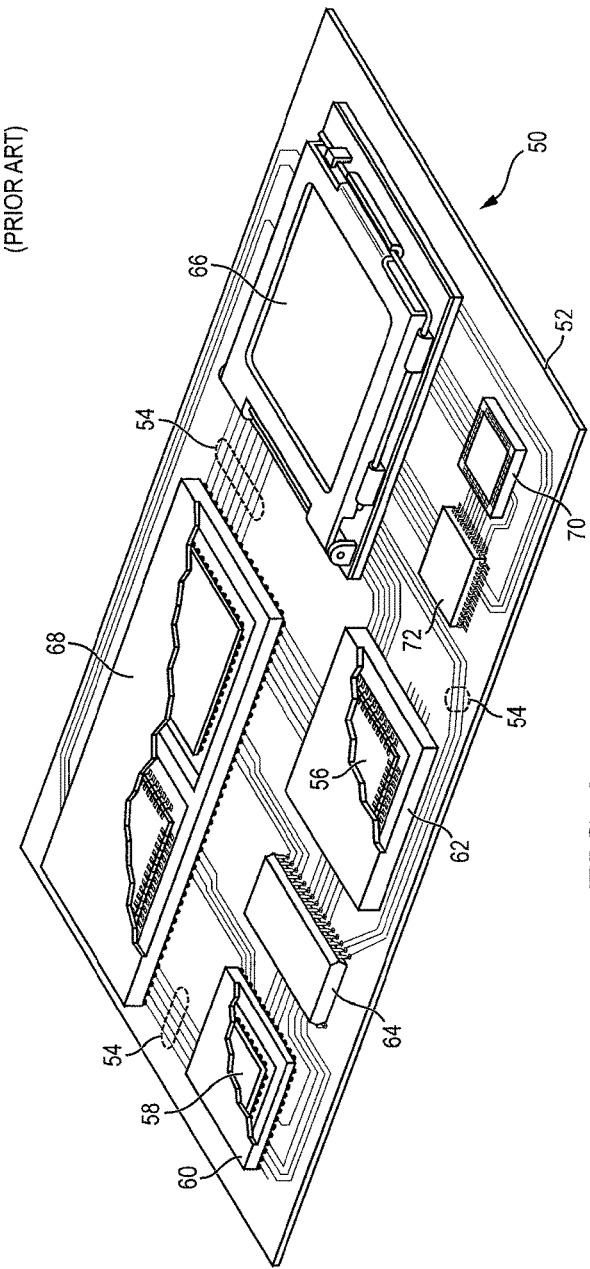
FIG. 2 illustrates a printed circuit board (PCB) with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
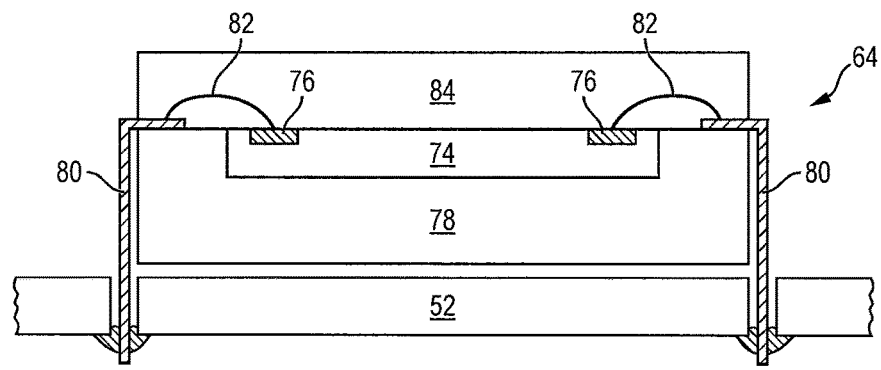
FIGS. 3a-3c illustrate further detail of the representative semiconductor packages mounted to the PCB.
Figure 3B:
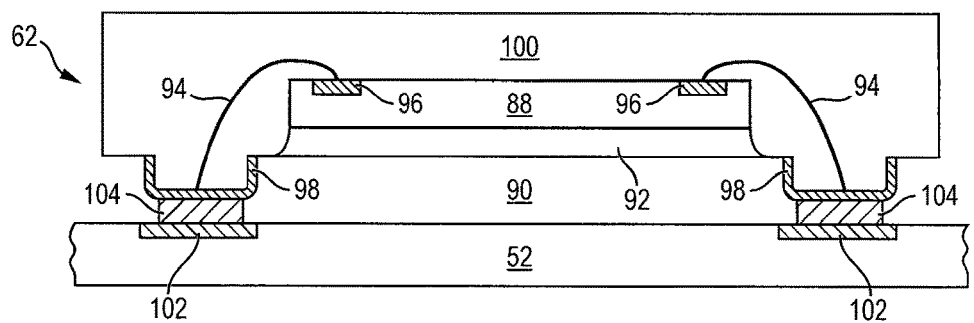
Figure 3C:
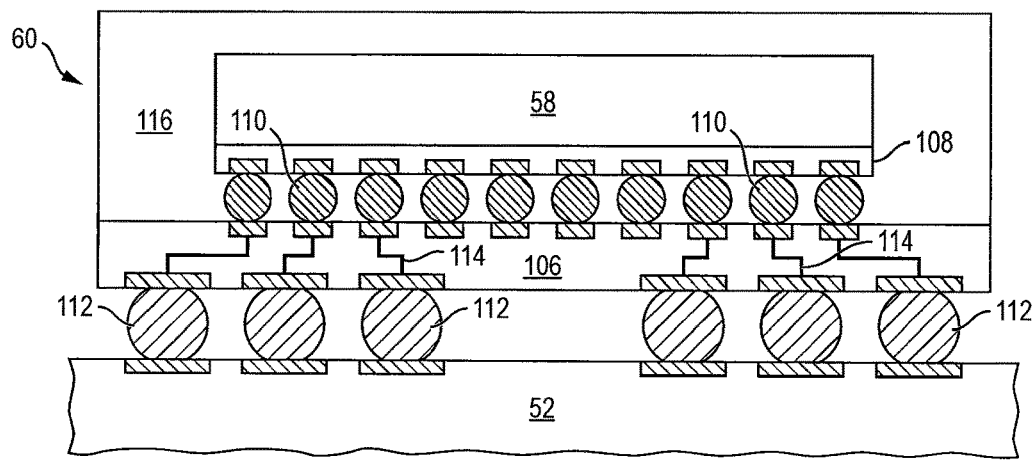

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4C:
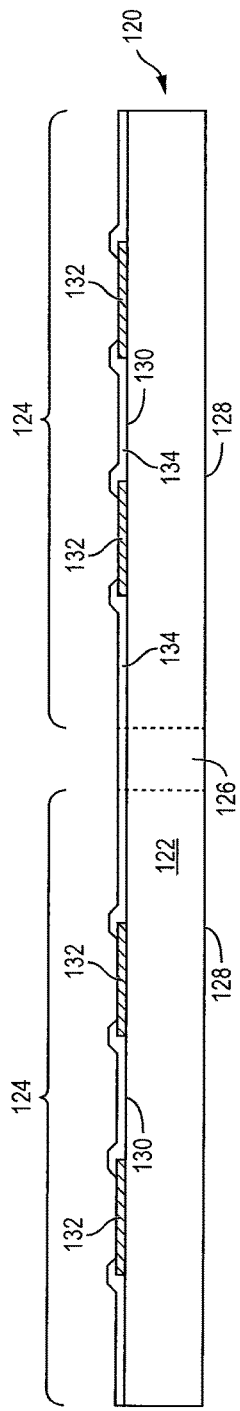

FIGS. 4a-4m illustrate, in relation to FIGS. 2 and 3a-3c, a process of forming dummy pillars over a semiconductor die to maintain a standoff distance between the semiconductor die and substrate. FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 4b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 4b. Alternatively, contact pads 132 can be offset in multiple rows such that a first row of contact pads is disposed a first distance from the edge of the die, and a second row of contact pads alternating with the first row is disposed a second distance from the edge of the die.

In FIG. 4c, an insulating or passivation layer 134 is formed over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 134 is removed by an etching process to expose conductive layer 132.

Figure 4D:
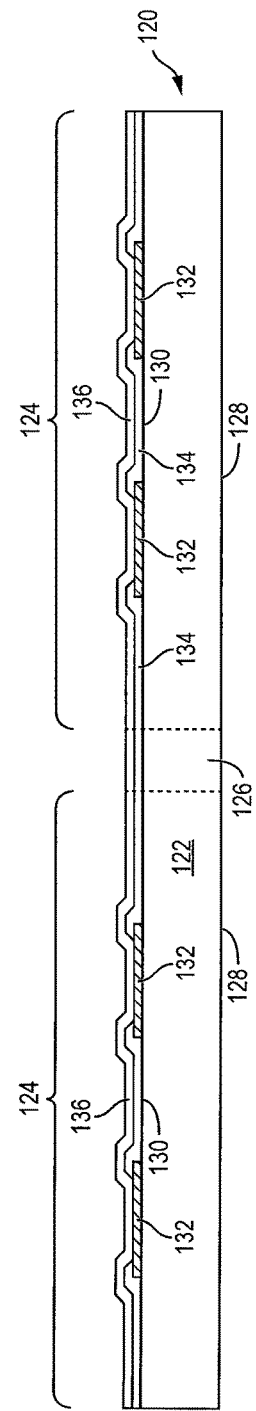
Figure 4E:
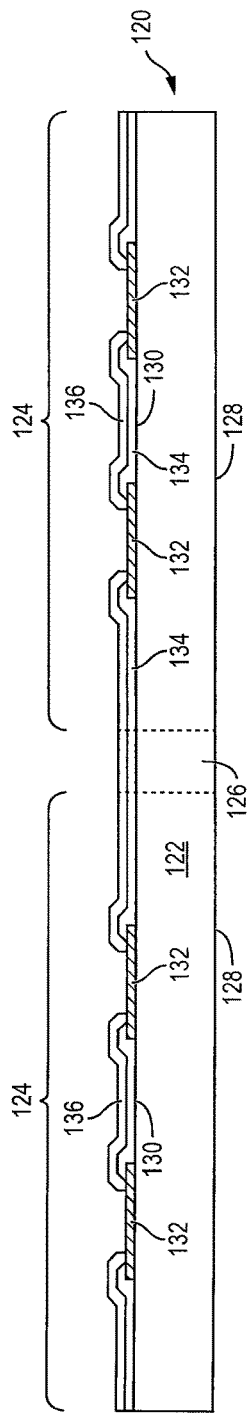

In FIG. 4d, an insulating or dielectric layer 136 is formed over insulating layer 134 and the exposed conductive layer 132 using PVD, CVD, printing, spin coating, spray coating, sintering or thermal oxidation. The insulating layer 136 contains one or more layers of SiO2, Si3N4, SiON, Ta2O5, Al2O3, benzocyclobutene (BCB), polyimide (PI), polybenzoxazoles (PBO), or other suitable dielectric material. A portion of insulating layer 136 is removed by an etching process to expose conductive layer 132, as shown in FIG. 4e.

In FIG. 4f, an electrically conductive layer 138 is conformally applied over the exposed conductive layer 132 and insulating layer 136 using a patterning and metal deposition process such as printing, PVD, CVD, sputtering, electrolytic plating, and electroless plating. In one embodiment, conductive layer 138 is Ti, titanium tungsten (TiW), or chromium (Cr) formed by sputtering. Alternatively, conductive layer 138 can be one or more layers of Al, Cu, Sn, Ni, Au, Ag, or other suitable electrically conductive material. Conductive layer 138 follows the contour of insulation layer 136 and conductive layer 132. Conductive layer 138 operates as an under bump metallization (UBM) layer for a later-formed pillar bump structure. Conductive layer 138 is electrically connected to conductive layer 132.

In FIG. 4g, a thick insulating layer 140 is formed over conductive layer 138 using PVD, CVD, printing, spin coating, spray coating, sintering or thermal oxidation. The insulating layer 140 can contain one or more layers of SiO2, Si3N4, SiON, Ta2O5, Al2O3, BCB, PI, PBO, solder resist, or other photo-sensitive material. In one embodiment, insulating layer 140 has a thickness of 30-50 micrometers (μm). A top surface of insulating layer 140 is substantially flat. A portion of insulating layer 140 is removed by patterning, exposure to ultraviolet (UV) light, and developing to form circular openings 142 and expose conductive layer 138, as shown in FIG. 4h. The size of openings 142 ranges from 40-60 μm or 80-100 μm. Another portion of insulating layer 140 is removed by patterning, exposure to UV light and developing to form circular openings 144 down through conductive layer 138 to insulating layer 136. Accordingly, conductive layer 138 is removed within openings 144. The size of openings 144 can be in the range of 20-50 micrometers (μm).

In another example of forming openings 142 and 144, the solder resist can include a DFR material with a PET support film. The DFR is laminated, undergoes an edge rinse, is aligned over conductive layer 132 (or outside conductive layer 132 for openings 144), the PET support film is removed, and the DFR material is then developed. The DFR can be irradiated using a visible light laser to form a desired pattern. The irradiated DFR material is then subjected to a developer, which selectively dissolves non-irradiated portions of the photoresist material and leaves the irradiated portions of the photoresist material intact.

Alternatively, circular openings 142 and 144 can be formed by laser direct ablation (LDA) using laser 146 to remove portions of insulating layer 140, and conductive layer 138 within openings 144, in applications requiring finer interconnect dimensions, as shown in FIG. 4i.

Figure 4J:
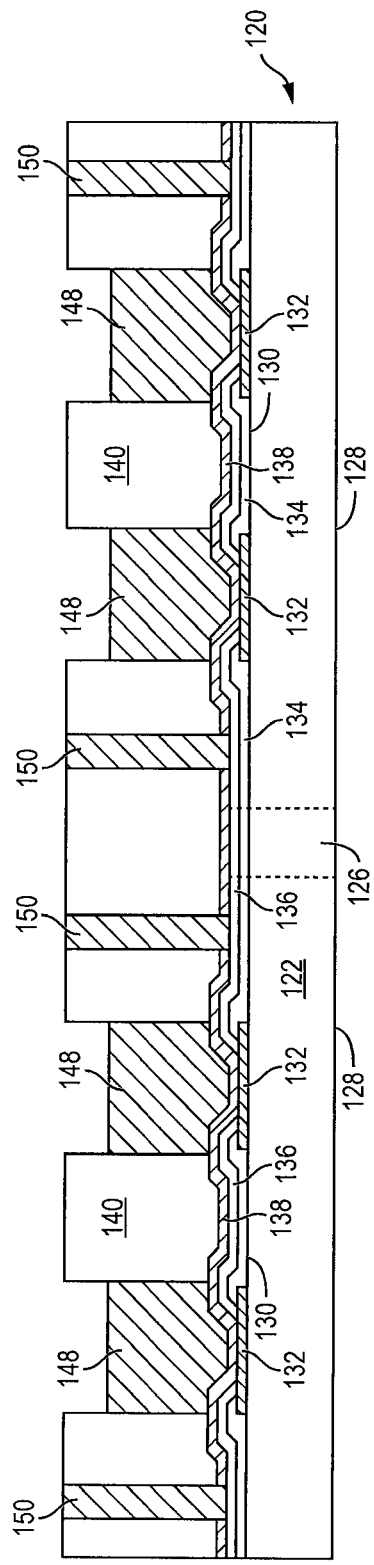

In FIG. 4j, an electrically conductive material is deposited into circular openings 142 using a patterning and metal deposition process such as PVD, CVD, sputtering, electrolytic plating, and electroless plating. The conductive material can be Al, Cu, Sn, Ni, Au, or Ag. The conductive material partially fills openings 142 to form conductive pillars or posts 148. Conductive pillars 148 are electrically connected to conductive layer 138.

In a similar manner, an electrically conductive material is deposited into circular openings 144 using a patterning and metal deposition process such as PVD, CVD, sputtering, electrolytic plating, and electroless plating. The conductive material can be Al, Cu, Sn, Ni, Au, or Ag. The conductive material fills openings 144 to form rigid pillars or posts 150. Alternatively, pillars 150 can be a non-conductive, rigid material such as polymer. Pillars 150 contact insulating layer 136 and are electrically isolated from conductive layers 132 and 138.

Figure 4K:
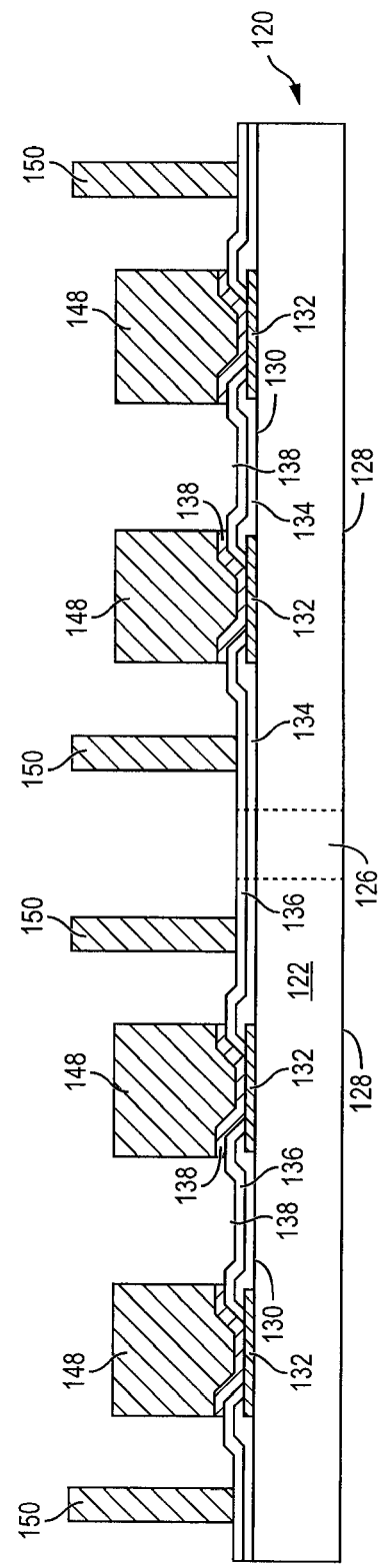

In FIG. 4k, the remaining portions of insulating layer 140 are removed leaving conductive pillars 148 disposed over conductive layer 138 and pillars 150 disposed over insulating layer 136. The height of pillars 150 is greater than a height of conductive pillars 148 to maintain the standoff distance between semiconductor die 124 and the mounting substrate. In one embodiment, conductive pillars 148 have a height of 30-80 μm, and pillars 150 have a height of 50-100 μm. In addition, conductive layer 138 outside a footprint of conductive pillars 148 is removed by an etching process. Accordingly, pillars 150 are electrically isolated and operate as dummy pillars for structural support.

Figure 4L:
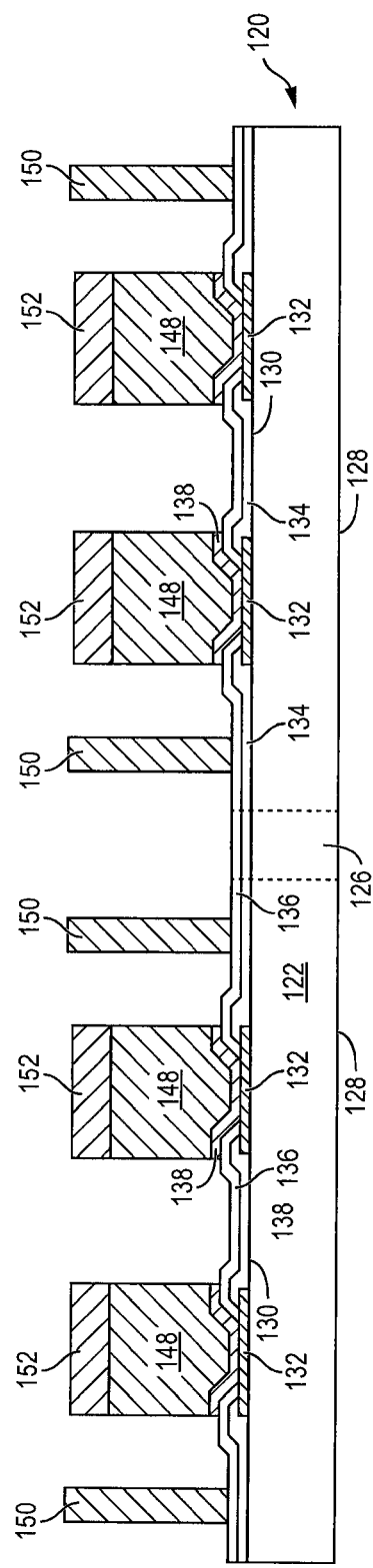
Figure 4M:
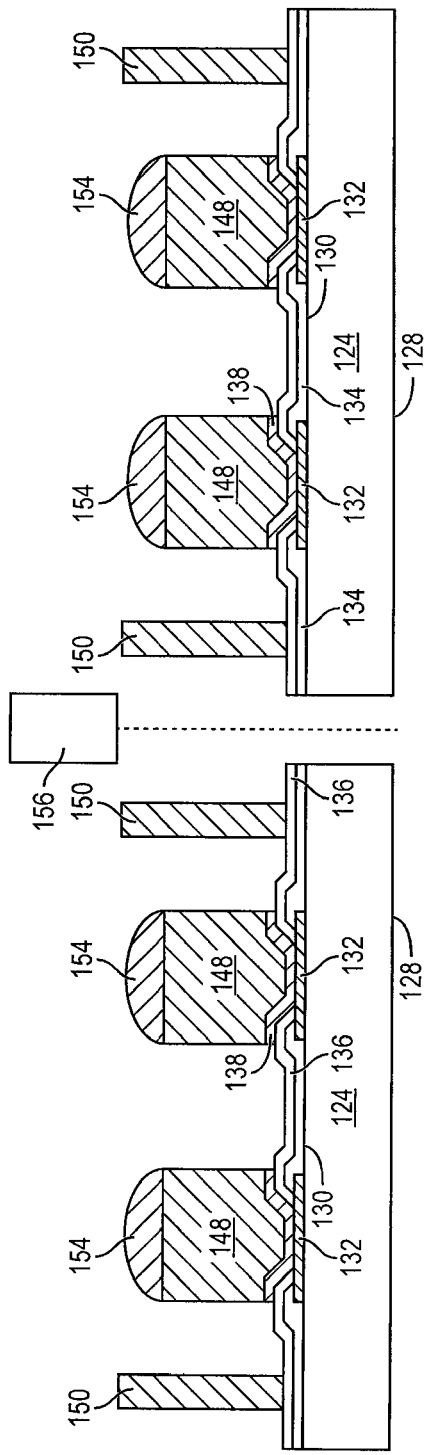

In FIG. 4l, an electrically conductive bump material 152 is deposited over conductive pillars 148 using an evaporation, electrolytic plating, electroless plating, ball drop, or screen printing process. Bump material 152 can be Al, Sn, Ni, Au, Ag, Pb, Bi, Cu, solder, and combinations thereof, with an optional flux solution. For example, bump material 152 can be eutectic Sn/Pb, high-lead solder, or lead-free solder. Bump material 152 is bonded to conductive pillars 148 using a suitable attachment or bonding process. In one embodiment, bump material 152 is reflowed by heating the material above its melting point to form bumps 154, as shown in FIG. 4m. In some applications, bumps 154 are reflowed a second time to improve electrical contact to conductive pillars 148. Bumps 154 can also be compression bonded to conductive pillars 148. Bumps 154 represent one type of interconnect structure that can be formed over conductive pillars 148. The interconnect structure can also use stud bump, micro bump, or other electrical interconnect.

In another embodiment, insulating layer 140 is removed after bump material 152 is deposited and reflowed into bumps 154.

Semiconductor wafer 120 is singulated through saw street 126 using a saw blade or laser cutting tool 156 into individual semiconductor die 124. FIG. 5a shows an expanded view of a semiconductor die 124 with multiple sets of conductive pillars 148 electrically connected through conductive layer 132 and 138 to the active and passive circuits within active surface 130. Dummy pillars 150 are formed over insulating layer 136 and electrically isolated from conductive layer 132 and 138 and the active and passive circuits within active surface 130. FIG. 5b is a top view of semiconductor die 124 with dummy pillars 150 spaced among conductive pillars 148. In particular, dummy pillars 150 are uniformly distributed around insulating layer 136 of semiconductor die 124, including at the corners of the semiconductor die and a central region of the semiconductor die, for structural support and to maintain a fixed standoff distance when later mounted to substrate 160.

FIG. 6a shows a semiconductor wafer or substrate 160 containing a base material, such as silicon, germanium, gallium arsenide, indium phosphide, or silicon carbide, for structural support. A plurality of vias is formed through substrate 160 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 162.

An electrically conductive layer or RDL 164 is formed over a first surface of substrate 160 and conductive vias 162 using a patterning and metal deposition process such as printing, PVD, CVD, sputtering, electrolytic plating, and electroless plating. Conductive layer 164 can be one or more layers of Al, Cu, Sn, Ni, Au, Ag, or other suitable electrically conductive material. Conductive layer 164 is electrically connected to conductive vias 162.

An electrically conductive layer or RDL 166 is formed over conductive vias 162 and a second surface of substrate 160, opposite the first surface of the substrate, using a patterning and metal deposition process such as printing, PVD, CVD, sputtering, electrolytic plating, and electroless plating. Conductive layer 166 can be one or more layers of Al, Cu, Sn, Ni, Au, Ag, or other suitable electrically conductive material. Conductive layer 166 is electrically connected to conductive vias 162. In another embodiment, conductive vias 162 are formed through substrate 160 after forming conductive layers 164 and/or 166.

Semiconductor die 124 from FIG. 5a is aligned over and mounted to substrate 160 using a pick and place operation with conductive pillars 148 and dummy pillars 150 oriented toward the substrate. FIG. 6b shows semiconductor die 124 mounted to substrate 160 with conductive pillars 148 electrically connected to conductive layer 164. More specifically, bumps 154 are reflowed to bond with conductive layer 164. Dummy pillars 150 have no electrical function and are in fact electrically isolated from conductive layers 138 and 164 and active surface 130. The height of pillars 150 is greater than a height of conductive pillars 148 to maintain a fixed standoff distance between semiconductor die 124 and substrate 160. The fixed standoff distance reduces the pressure on the bump material during reflow of bumps 154 to conductive layer 164. The surface tension retains the bump material substantially within the footprint of conductive pillars 148 during the reflow process. Any excess bump material is less likely to flow outward and contact an adjacent conductive pillar 148 during reflow. Accordingly, dummy pillars 150 reduce bridging defects as found in the prior art while enabling a fine pitch electrical interconnect.

Figure 6C:
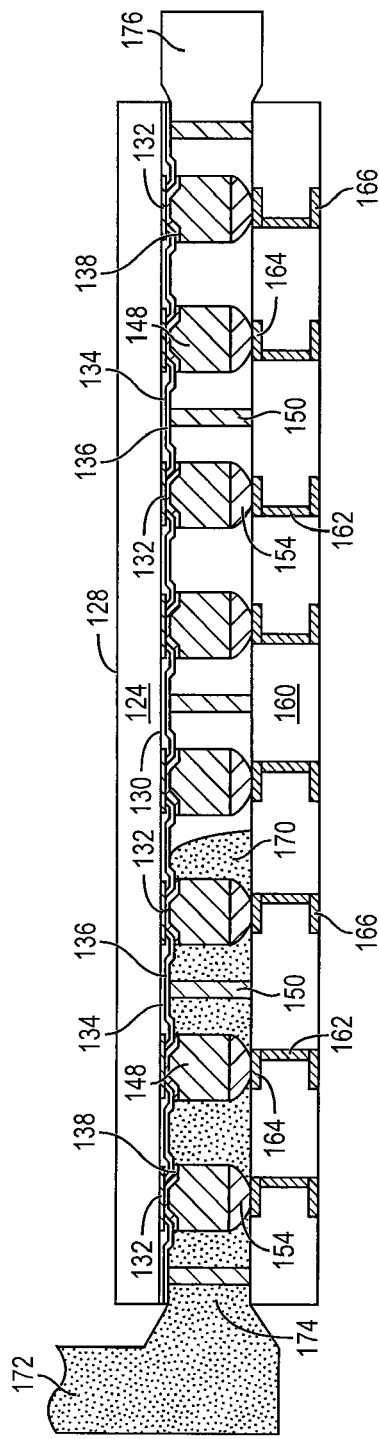
Figure 6D:
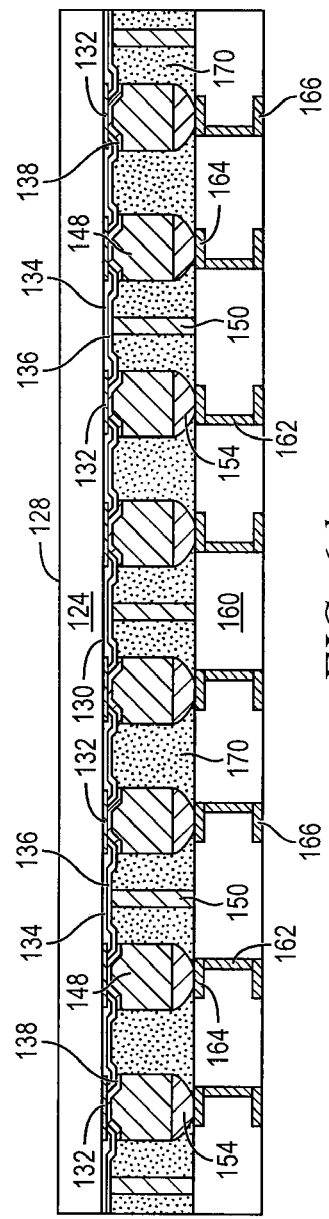

In FIG. 6c, a mold underfill (MUF) material 170 is deposited between semiconductor die 124 and substrate 160. In one embodiment, MUF 170 is injected under pressure from a dispensing needle 172 into gap 174 between semiconductor die 124 and substrate 160 using MUF process. A vacuum assist 176 can draw MUF 170 to aid with uniform distribution. MUF 170 can be polymer composite material, such as epoxy resin with filler, epoxy acrylate with filler, or polymer with proper filler. MUF 170 is non-conductive and environmentally protects the semiconductor device from external elements and contaminants. FIG. 6d shows MUF 170 disposed between semiconductor die 124 and substrate 160. The fixed standoff distance between semiconductor die 124 and substrate 160 as maintained by dummy pillars 150 reduces voids in MUF 170.

Figure 7A:
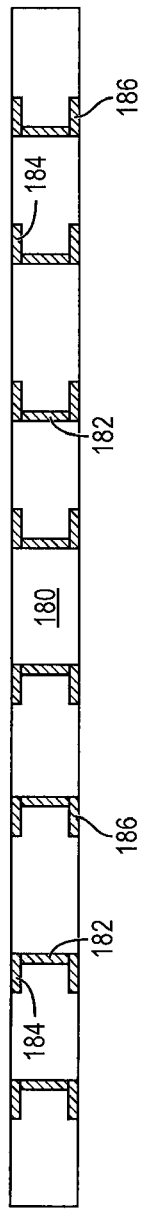
FIGS. 7a-7e illustrate a process of forming dummy pillars over a substrate to maintain a standoff distance between a semiconductor die and substrate.

FIG. 7a shows a semiconductor wafer or substrate 180 containing a base material, such as silicon, germanium, gallium arsenide, indium phosphide, or silicon carbide, for structural support. A plurality of vias is formed through substrate 180 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 182.

An electrically conductive layer or RDL 184 is formed over a first surface of substrate 180 and conductive vias 182 using a patterning and metal deposition process such as printing, PVD, CVD, sputtering, electrolytic plating, and electroless plating. Conductive layer 184 can be one or more layers of Al, Cu, Sn, Ni, Au, Ag, or other suitable electrically conductive material. Conductive layer 184 is electrically connected to conductive vias 182.

An electrically conductive layer or RDL 186 is formed over conductive vias 182 and a second surface of substrate 180, opposite the first surface of the substrate, using a patterning and metal deposition process such as printing, PVD, CVD, sputtering, electrolytic plating, and electroless plating. Conductive layer 186 can be one or more layers of Al, Cu, Sn, Ni, Au, Ag, or other suitable electrically conductive material. Conductive layer 186 is electrically connected to conductive vias 182. In another embodiment, conductive vias 182 are formed through substrate 180 after forming conductive layers 184 and/or 186.

Figure 7B:
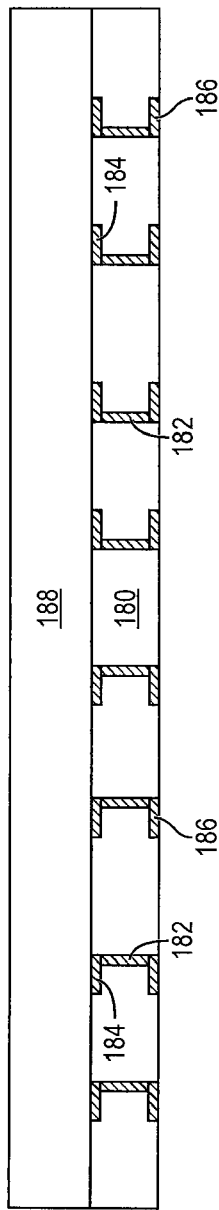
Figure 7C:
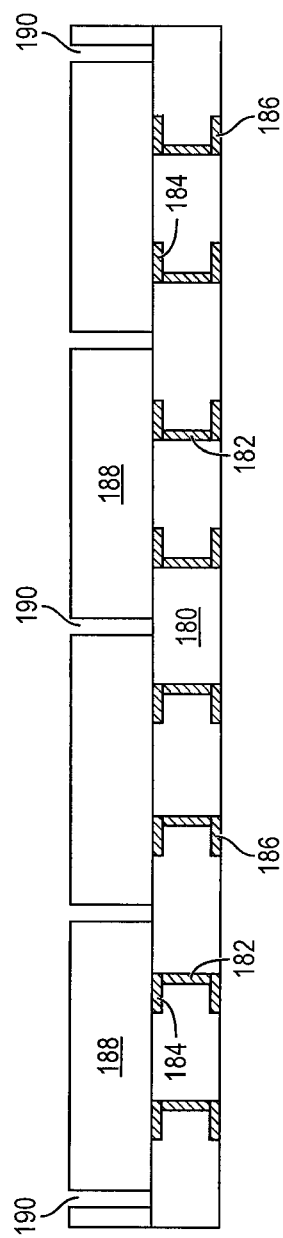

In FIG. 7b, a thick insulating layer 188 is formed over substrate 180 and conductive layer 184 using PVD, CVD, printing, spin coating, spray coating, sintering or thermal oxidation. The insulating layer 188 can contain one or more layers of SiO2, Si3N4, SiON, Ta2O5, Al2O3, BCB, PI, PBO, solder resist, or other photo-sensitive material. In one embodiment, insulating layer 188 has a thickness of 30-50 μm. A top surface of insulating layer 188 is substantially flat. A portion of insulating layer 188 is removed by patterning, exposure to UV light and developing to form circular openings 190 over non-conductive areas of substrate 180, as shown in FIG. 7c. The size of openings 190 ranges from 20-50 μm.

In another example of forming openings 190, the solder resist can include a DFR material with a PET support film. The DFR is laminated, undergoes an edge rinse, is aligned outside electrical contact areas of substrate 180, the PET support film is removed, and the DFR material is then developed. The DFR can be irradiated using a visible light laser to form a desired pattern. The irradiated DFR material is then subjected to a developer, which selectively dissolves non-irradiated portions of the photoresist material and leaves the irradiated portions of the photoresist material intact.

Alternatively, circular openings 190 can be formed by LDA using a laser, similar to FIG. 4i, to remove a portion of insulating layer 188 in applications requiring finer interconnect dimensions.

Figure 7D:
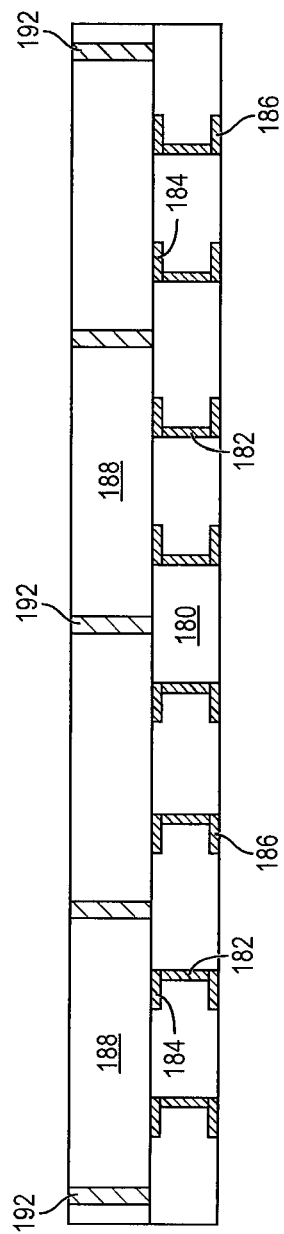

In FIG. 7d, an electrically conductive material is deposited into circular openings 190 using a patterning and metal deposition process such as PVD, CVD, sputtering, electrolytic plating, and electroless plating. The conductive material can be Al, Cu, Sn, Ni, Au, or Ag. The conductive material fills openings 190 to form rigid pillars or posts 192. Alternatively, pillars 192 can be a non-conductive, rigid material such as polymer. Pillars 192 are disposed over non-conductive areas of substrate 180.

Figure 7E:
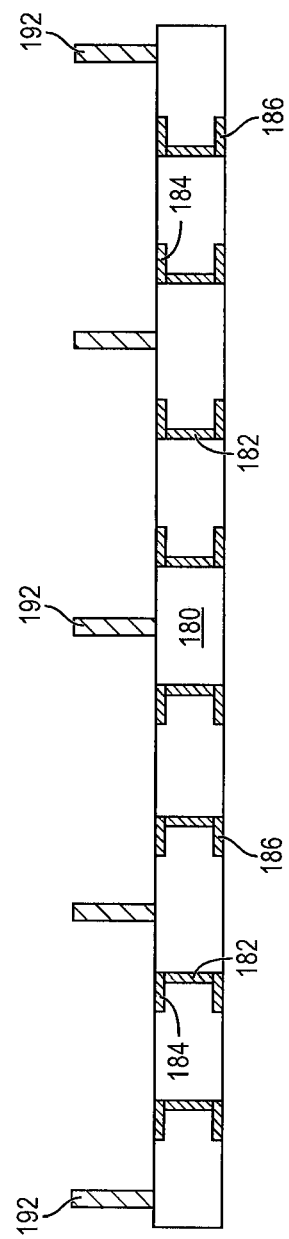

In FIG. 7e, the remaining portions of insulating layer 188 are removed leaving pillars 192 disposed over non-conductive areas of substrate 180. In one embodiment, pillars 192 have a height of 50-100 μm. Accordingly, pillars 192 are electrically isolated and operate as dummy pillars for structural support of later mounted semiconductor die 194.

FIG. 8a shows a semiconductor die 194 originating from a semiconductor wafer, similar to FIG. 4a. Semiconductor die 194 has a back surface 198 and active surface 200 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 200 to implement analog circuits or digital circuits, such as DSP, ASIC, memory, or other signal processing circuit. Semiconductor die 194 may also contain IPDs, such as inductors, capacitors, and resistors, for RF signal processing. In one embodiment, semiconductor die 194 is a flipchip type die.

An electrically conductive layer 202 is formed over active surface 200 using PVD, CVD, electrolytic plating, electroless plating process, or other suitable metal deposition process, similar to FIG. 4b. Conductive layer 202 can be one or more layers of Al, Cu, Sn, Ni, Au, Ag, or other suitable electrically conductive material. Conductive layer 202 operates as contact pads electrically connected to the circuits on active surface 200. Contact pads 202 can be disposed side-by-side a first distance from the edge of semiconductor die 194. Alternatively, contact pads 202 can be offset in multiple rows such that a first row of contact pads is disposed a first distance from the edge of the die, and a second row of contact pads alternating with the first row is disposed a second distance from the edge of the die.

An insulating or passivation layer 204 is formed over active surface 200 and conductive layer 202 using PVD, CVD, printing, spin coating, spray coating, sintering or thermal oxidation, similar to FIG. 4c. The insulating layer 204 contains one or more layers of SiO2, Si3N4, SiON, Ta2O5, Al2O3, or other material having similar insulating and structural properties. A portion of insulating layer 204 is removed by an etching process to expose conductive layer 202.

An insulating or dielectric layer 206 is formed over insulating layer 204 and the exposed conductive layer 202 using PVD, CVD, printing, spin coating, spray coating, sintering or thermal oxidation, similar to FIG. 4d. The insulating layer 206 contains one or more layers of SiO2, Si3N4, SiON, Ta2O5, Al2O3, BCB, PI, PBO, or other suitable dielectric material. A portion of insulating layer 206 is removed by an etching process to expose conductive layer 202.

An electrically conductive layer 208 is conformally applied over the exposed conductive layer 202 and insulating layers 206 using a patterning and metal deposition process such as printing, PVD, CVD, sputtering, electrolytic plating, and electroless plating, similar to FIG. 4f. In one embodiment, conductive layer 208 is Ti, TiW, or Cr formed by sputtering. Alternatively, conductive layer 208 can be one or more layers of Al, Cu, Sn, Ni, Au, Ag, or other suitable electrically conductive material. Conductive layer 208 follows the contour of insulation layer 206 and conductive layer 202. Conductive layer 208 operates as a UBM layer for a later-formed bump structure. Conductive layer 208 is electrically connected to conductive layer 202.

A thick insulating layer is formed over conductive layer 208 using PVD, CVD, printing, spin coating, spray coating, sintering or thermal oxidation, similar to FIG. 4g. The insulating layer can contain one or more layers of SiO2, Si3N4, SiON, Ta2O5, Al2O3, BCB, PI, PBO, solder resist, or other photo-sensitive material. A portion of the insulating layer is removed by patterning, exposure to UV light and developing to form circular openings and expose conductive layer 208. Alternatively, the circular openings can be formed by LDA using a laser, similar to FIG. 4i, to remove a portion of the insulating layer in applications requiring finer interconnect dimensions.

An electrically conductive material is deposited into the circular openings using a patterning and metal deposition process such as PVD, CVD, sputtering, electrolytic plating, and electroless plating, similar to FIG. 4j. The conductive material can be Al, Cu, Sn, Ni, Au, or Ag. The conductive material partially fills the openings to form conductive pillars or posts 210. Conductive pillars 210 are electrically connected to conductive layer 208.

The remaining portions of the insulating layer are removed leaving conductive pillars 210 disposed over conductive layer 208. In one embodiment, conductive pillars 210 have a height of 30-80 μm. In addition, conductive layer 208 outside a footprint of conductive pillars 210 is removed by an etching process.

An electrically conductive bump material is deposited over conductive pillars 210 using an evaporation, electrolytic plating, electroless plating, ball drop, or screen printing process, similar to FIG. 4l. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive pillars 210 using a suitable attachment or bonding process. In one embodiment, the bump material is reflowed by heating the material above its melting point to form bumps 212. In some applications, bumps 212 are reflowed a second time to improve electrical contact to conductive pillars 210. Bumps 212 can also be compression bonded to conductive pillars 210. Bumps 212 represent one type of interconnect structure that can be formed over conductive pillars 210. The interconnect structure can also use stud bump, micro bump, or other electrical interconnect.

Semiconductor die 194 is aligned over and mounted to substrate 180 using a pick and place operation with conductive pillars 210 oriented toward the substrate. FIG. 8b shows semiconductor die 194 mounted to substrate 180 with conductive pillars 210 electrically connected to conductive layer 184. More specifically, bumps 212 are reflowed to bond with conductive layer 184. Dummy pillars 192 contact insulating layer 206 of semiconductor die of substrate 180. Dummy pillars 192 have no electrical function and are in fact electrically isolated from conductive layers 208 and 184 and active surface 200. The height of dummy pillars 192 is greater than a height of conductive pillars 210 to maintain a fixed standoff distance between semiconductor die 194 and substrate 180. The fixed standoff distance reduces the pressure on the bump material during reflow of bumps 212. The surface tension retains the bump material substantially within the footprint of conductive pillars 210 during the reflow process. Any excess bump material is less likely to flow outward and contact an adjacent conductive pillar 210 during reflow. Accordingly, dummy pillars 192 reduce bridging defects as found in the prior art while enabling a fine pitch electrical interconnect.

Figure 8C:
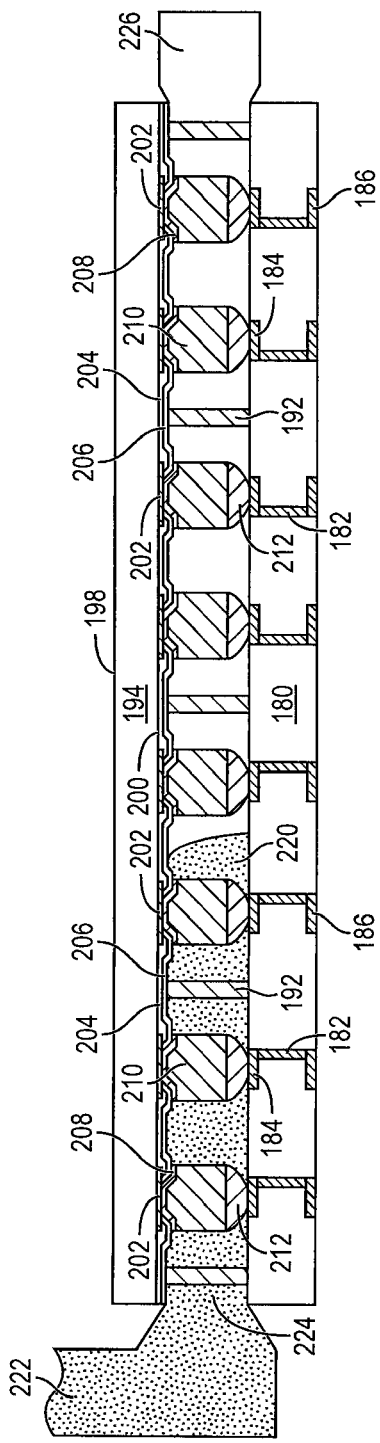
Figure 8D:
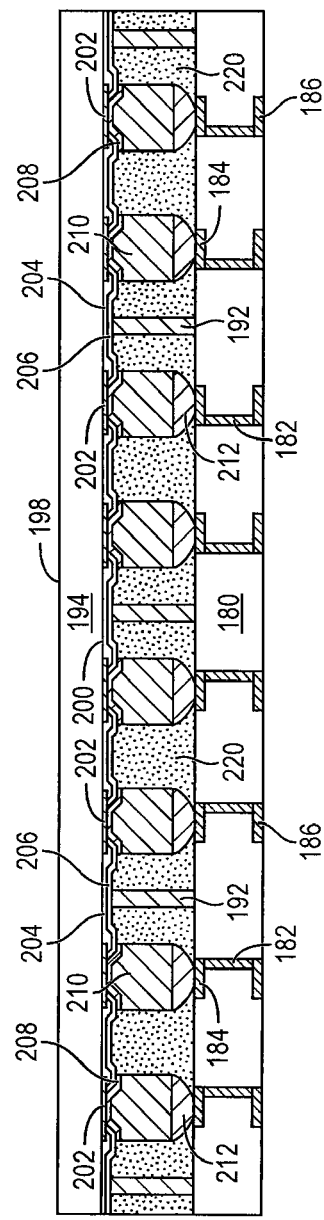

In FIG. 8c, a MUF material 220 is deposited between semiconductor die 194 and substrate 180. In one embodiment, MUF 220 is injected under pressure from a dispensing needle 222 into gap 224 between semiconductor die 194 and substrate 180 using MUF process. A vacuum assist 226 can draw MUF 220 to aid with uniform distribution. MUF 220 can be polymer composite material, such as epoxy resin with filler, epoxy acrylate with filler, or polymer with proper filler. MUF 220 is non-conductive and environmentally protects the semiconductor device from external elements and contaminants. FIG. 8d shows MUF 220 disposed between semiconductor die 194 and substrate 180. The fixed standoff distance between semiconductor die 184 and substrate 180 as maintained by dummy pillars 192 reduces voids in MUF 220.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   forming a conductive layer over the semiconductor die;
   forming an insulating layer over the conductive layer;
   depositing a conductive material within openings of the insulating layer to form a plurality of conductive pillars over the conductive layer and a plurality of rigid dummy pillars over the semiconductor die electrically isolated from the conductive layer and conductive pillars, wherein a height of the rigid dummy pillars is greater than a height of the conductive pillars;
   disposing a bump material over the conductive pillars;
   providing a substrate;
   disposing the semiconductor die over the substrate after forming the conductive pillars and rigid dummy pillars with the rigid dummy pillars maintaining a fixed standoff distance between the semiconductor die and substrate; and
   reflowing the bump material, wherein surface tension retains the bump material within a footprint of the conductive pillars and the fixed standoff distance reduces pressure on the bump material.

2. The method of claim 1, further including removing a remaining portion of the insulating layer leaving the conductive pillars disposed over the conductive layer.

3. The method of claim 1, further including depositing a mold underfill material between the semiconductor die and substrate.

4. The method of claim 1, wherein the height of the rigid dummy pillars is greater than the height of the conductive pillars to maintain the fixed standoff distance between the semiconductor die and substrate.

* * * * *